United States Patent [19]

Hoppe

[11] 4,209,698

[45] Jun. 24, 1980

[54] TRANSMISSION-TYPE CHARGED PARTICLE BEAM APPARATUS

[75] Inventor: Walter Hoppe, Lochham, Fed. Rep. of Germany

[73] Assignee: Max-Planck-Gesellschaft zur Förderung der Wissenschaften e.V., Göttingen, Fed. Rep. of Germany

[21] Appl. No.: 973,972

[22] Filed: Dec. 28, 1978

Related U.S. Application Data

[63] Continuation of Ser. No. 807,695, Jun. 17, 1977, abandoned, which is a continuation of Ser. No. 673,574, Apr. 5, 1976, abandoned, which is a continuation of Ser. No. 499,242, Aug. 21, 1974, abandoned, which is a continuation-in-part of Ser. No. 319,106, Dec. 27, 1972, abandoned.

[30] Foreign Application Priority Data

Dec. 28, 1971 [DE] Fed. Rep. of Germany ....... 2165089

[51] Int. Cl.$^2$ .......................................... G01M 23/00
[52] U.S. Cl. .................................... 250/311; 250/397
[58] Field of Search ............... 250/310, 311, 307, 396, 250/397; 313/359, 361

[56] References Cited

U.S. PATENT DOCUMENTS

| | | | |
|---|---|---|---|
| 2,464,419 | 3/1949 | Smith | 250/307 |
| 3,100,262 | 8/1963 | Welska | 250/311 |
| 3,576,438 | 4/1971 | Pease | 250/397 |
| 3,749,964 | 7/1973 | Hirata | 250/311 |
| 3,908,124 | 9/1975 | Rose | 250/311 |

Primary Examiner—Bruce C. Anderson
Attorney, Agent, or Firm—Ladas, Parry, Von Gehr, Goldsmith & Deschamps

[57] ABSTRACT

A transmission-type charged particle beam apparatus comprising a vacuum envelope enclosing, first means, having at least ten individual charged particle sources to separately produce at least ten individual charged particle beams, second means to supporting a specimen to be investigated; third means to project each of the beams along a different beam path through a predetermined region of the specimen, the beam paths collectively converging about a rotational axis of symmetry at equal angles of at least 30° so as to intersect at an apex lying within the predetermined region of said specimen, individual particle detectors for each beam, and a particle optics lens system to focus each of the beams transmitted through the specimen onto a corresponding one of the particle detectors for separate detection of each beam, the lens system having at least one particle optics lens with an annular apertured pole structure to produce for each beam a deflecting field limited to a respective radial and circumferential area of the pole structure.

11 Claims, 22 Drawing Figures

TRANSMISSION-TYPE CHARGED PARTICLE BEAM APPARATUS

This is a continuation of application Ser. No. 807,695 filed June 17, 1977 (abandoned) which was a continuation of Ser. No. 673,574 filed Apr. 5, 1976 (abandoned) which was a continuation of application Ser. No. 499,242 filed Aug. 21, 1974 (abandoned) which was a continuation-in-part of application Ser. No. 319,106 filed Dec. 27, 1972 (abandoned).

This invention relates to a transmission-type charged particle beam apparatus for producing a representation of the distribution of charged particles in each of a predetermined number of beams of charged particles transmitted by a specimen under investigation.

BACKGROUND OF THE INVENTION

It is known from various publications, e.g. Naturwissenschaften 55 (1968) pp 333-336; Optik 29, 1969, pp 617 to 621, Nature Vol. 217, Jan. 13, 1968 pp 130 to 134 and J. Mol. Biol. (1970) 52 (355-369) that the three dimensional structure of a small object can be reconstructed from electron micrographs forming two dimensional projections of the three dimensional structure taken in different directions.

According to the prior art, the transmission images forming the different projections are made in a conventional transmission-type electron microscope with varying orientations of the specimen relative to the imaging electron beam. This involves tilting of the specimen between the different exposures and it has been proved very difficult to achieve such tilting with sufficient precision to secure that the electron beam penetrates always the same region of the specimen under investigation, independently of the angular position of the specimen.

It is obvious that the above described investigations can be performed also with a beam of ions rather than a beam of electrons, and therefore the terms "particle optics" and the like will be used in the following in the sense of generalization of the term "electron optics" and the like.

It is an object of the invention to provide a transmission-type charged particle beam apparatus of the type outlined above which is able to produce representations of a number of different projections of a three-dimensional structure without the necessity of mechanically tilting the specimen under investigation with respect to the probing particle beam.

Another object of the invention is to provide for an apparatus of the type defined above by which a multitude of representations may be produced without changing the relationship of the object and image (or detection) planes.

A further object of the invention is to provide an apparatus of this type adapted to produce the necessary representations with high precision and speed.

A further object of the invention is to provide a transmission-type charged particle apparatus which employs particle beam paths which form large angles with each other, e.g. angles up to 80 to 120 degrees, without impairing the quality of said representations by aberrations of the particle optics elements employed for projecting and focussing said particles to form the desired representations or images.

An embodiment of the invention comprises a particle optics system which exhibits essentially rotational symmetry with respect to an axis. Similar to a conventional electron microscope, the present apparatus comprises means for projecting charged particles through a specimen and a particle optics system which may comprise an objective lens system, an intermediate lens system and a projective lens system, to image particles transmitted by said specimen into an image plane where particle detecting means, such as a fluorescent screen, a photographic plate, or an electronic scanning means, e.g. a television-type camera tube provided with a luminescent screen, may be located. According to an important aspect of the invention, the path of said particle beams forming said images or representations are limited to relatively narrow regions both in a radial direction and in a circumferential direction with respect to said axis. Thus, only a ring-like zone off the axis and in this zone only a number of narrow segments are permitted to be transverse by said particles. This allows one to compensate for aberrations in spite of the fact that the beams occupy an aperture angle which is much larger than can be handled with a normal particle optics system, i.e. magnetic or electrostatic lenses having a circular axial area traversed by the particles.

It is known from U.S. Pat. No. 2,436,676 that several exposures of an object can be made by tilting the specimen between the exposures or observations. But this method would fail, if the objects are very small. Mechanical movements cannot be done with sufficient precision, if objects are to be studied which have a size of the order of angstrom units. Besides mechanical object tilting there exists also the technique of tilting the beam path by tilting stages. But also here the accuracy is very low, especially if the individual tilted exposures must be repeated several times in order to reduce the influence of radiation damage by averaging over the exposures. It is the basic idea of the invention, that ray bundles will be used, which are tilted with reference to the microscope axis by an unusually large angle. Ray bundles tilted by these large angles until now have not been disclosed in electron microscopy, because there was no possibility to correct the electron microscope objective lens for aperture angles of approximately 50 degrees. According to the invention ray bundles are used in such a way, that a substantial part of a bundle is tilted against the microscope axis by a substantial angle. The bundles themselves however, are narrow discrete bundles and not a large varying cone of rays. If one uses single, narrow, discrete ray bundles there is the possibility to correct the lens errors for every single bundle. This would be practically impossible, if all ray bundles would cover continuously, e.g., a conical surface. The correction of the lens errors of bundles, which are tilted by large angles with reference to the microscope axis will be done by correction devices, which in the case of narrow bundles can be applied with success. Now it makes no difference in principle, whether several ray bundles of this kind are produced, simultaneously, or whether these ray bundles are produced in a sequential order. In the case of a simultaneous production one correction device is necessary for every ray bundle whereas in the case of sequential production a single correction device can be constructed, which encloses sequentially the paths of the single ray bundles and which corrects the errors in each bundle.

The idea to work with single narrow ray bundles and to correct the lens errors of every bundle separately, tilted by a large angle with reference to the microscope axis, has not been made known until now.

A microscope, working along the scheme mentioned above, has the advantage that a three-dimensional object can be illuminated by ray bundles, which are tilted by large angles with respect to the axis so that the information of the object can be collected nearly completely, in such a way that a very substantial part of the reciprocal space corresponding to this object can be covered.

Another substantial advantage of this device is, that the object plane and the image plane will not be changed, which is important inspite of the large depth of focus in electron microscopes. The equidistance contours of the pupil function are therefore parallel to the object plane.

Electrostatic as well as magnetic lens systems will be understood, when lens systems are mentioned in this application. It is well known, that both systems are in many cases interchangeable.

According to the invention a lens system is used in a corpuscular ray microscope, which produces images from several corpuscular ray bundles penetrating a fixed object, these images being the basis for the determination of the fourier coefficients of nearly the total reciprocal space corresponding to the object and which tilts such narrow corpuscular ray bundles with reference to the microscope axis by maximal angles, which are at least 15 degrees, peferably 40 degrees to 60 degrees.

For the correction of these single, narrow bundles there are provided pupil function correction devices. These "pupil function correction devices" can be of a known type. In the case of e.g., ring lenses they can be cores placed in the lens axis, their electromagnetic or electrostatic fields compensating for the increase of the refraction power in a ring zone of a conventional lens with rotation symmetry. Indeed these cores have now a completely different function, they do not correct the complete ring zone of a narrow axial bundle, but a partial zone of a narrow non-axial bundle. This different function is the reason, that previously unused field shapes - e.g., non-rotation-symmetrical fields, e.g., multi-poles acting on the outside, can now be used as cores. Due to the wide opening of the ray bundles there is in the center of a lens enough space (contrary to the known core lenses) to provide multipole fields. Further new correction possibilities follow, if the pole shoes (or electrodes) are properly shaped. The properties of conventional round lenses are scarcely dependent on the shape of the poles (or electrodes). Essentially the field shape along the lens axis is important. Special properties will be further achieved if one abandons the rotational symmetry of the lens fields. Lenses with non-rotational symmetry (especially magnetic lenses) are known. But also here the function is different. Whereas in the invention the pupil function must only be corrected for a non-axial partial bundle, the correction for the whole (narrowly limited lens opening is the aim in the known lenses with non-rotational symmetry another known method in the case of rotationally symmetrical lenses which use a complete ring zone for imaging similarly as core lenses, is the use of at least two axially arranged lenses in such a way, that overlapping circles (astigmatic intermediate images) of cone-shaped ray surfaces appear. In this system outer and inner beam cones change their respective positions in the crossing circles. Also this correction possibility, which in the case of conventional lenses only can be used for narrow axial ring zones, is applicable for another purpose for the non-axial bundles, especially if it is combined with a corrective shaping of the pole shoes or combined with cores.

An entirely new correction principle should especially be mentioned. Generally the image of a lens with rotational symmetry formed by non-axial partial bundles shows astigmatism even for objects which lie on the lens axis. For the correction of these single narrow bundles stigmator correction devices are provided. These stigmator correction devices do not correspond to the usual stigmators. They could perhaps be called generalized stigmators or eccentric stigmators. Hereinafter they will be referred to for simplicity sake as stigmator correction devices. They should be understood as electromagnetic or electrostatic multipoles, which create an asymmetric field which is able to correct the astigmatism of the ray bundles.

The number of ray bundles should be large, preferably 30 ray bundles should be used, but in general at least 10 ray bundles are suitable. In extreme cases also three bundles would be sufficient. But on the whole one should try to use much more than three ray bundles for imaging.

The bundles can be arranged in any desired arrangement. In a preferred arrangement they are arranged on a conical surface.

Another preferred arrangement is the arrangement in a plane. In this case beam deflecting devices can also be used, which are used for a completely different purpose in mass spectroscopy e.g., magnetic sector fields as later shown in FIG. 21.

The production of the primary beam bundles can be done in different ways. For example several beam sources can be used. If not all bundles are used for imaging, the primary beam bundles not necessary for an exposure can be eliminated by screening or deflection. But also a single beam source can be sufficient, if a condensor system is constructed in such a way that only single ray bundles will pass through this system.

For imaging, the already mentioned ring zone lens can be used as a lens system. If desired, its inner part can be used for positioning of additional correction devices.

An advantageous solution is a capacitor with rotational symmetry. The capacitor plates are sections of surfaces of rotation bodies. The marginal zones of these capacitor plates can be formed in special shapes, e.g., curved from the middle of the capacitor outward, in such a way, that the stray fields of the capacitor will be used for the correction of imaging. In such a way one can get a well corrected lens system.

An entirely different type of lens system which also can be used is defined by an arrangement of a certain number of magnets which are arranged on a circle in such a way, that north poles and south poles alternate along the periphery of the circle. In this lens system obviously only every second field is suitable for imaging. As the rays in the innermost fields are deflected outward, they will be lost for imaging.

As magnets, coils are especially suitable, which are made superconducting by cooling and which deliver strong magnetic fields.

Another possible imaging lens system is a toroidlike coil, which produces a field sufficiently strong for imaging if it is made superconducting. The windings of such a coil must be sufficiently loose, so that corpuscular beams can pass through the coil.

It is also possible to make a lens from two magnetic rings with holes for passing of the single ray beams. The drillings in both magnetic rings are in alignment in such a way that they allow the penetration of a ray through two corresponding drillings in both magnetic rings.

Finally there is also the possibility to irradiate an object from different directions in such a way that either the beam source or the corresponding imaging device is moved sequentially so that the rays hit the object at different angles or several beam sources and several lens systems are provided which are arranged at different angles with reference to the object. The object may be fixed. The ray directions can be selected in this example in such a way, that all rays lie in one plane or the rays coincide e.g., with the surface of a cone.

The lens system according to the invention may also be used in a corpuscular beam microscope working as a scanning microscope.

In spite of the fact, that electron beams will primarily be understood as corpuscular beams, in principle also other radiations can be used, because the basic idea of the present invention is not confined to a certain radiation.

Further objects, advantages and features of the invention will become apparent upon reading the following description of specific embodiments taken in conjunction with the drawings, wherein:

FIG. 1 shows a schematic perspective cross-sectional view of the essential portions of the particle optics system of a first embodiment of the invention;

FIG. 2 a more detailed cross-sectional view of a portion of the apparatus according to FIG. 1;

FIG. 3 a schematic view, similar to FIG. 1, of a modification of the apparatus according to FIG. 1;

FIG. 4 is a more detailed view of a portion of the apparatus according to FIG. 3;

FIG. 5 a schematic sectional view of a further embodiment of the invention;

Figure 20:
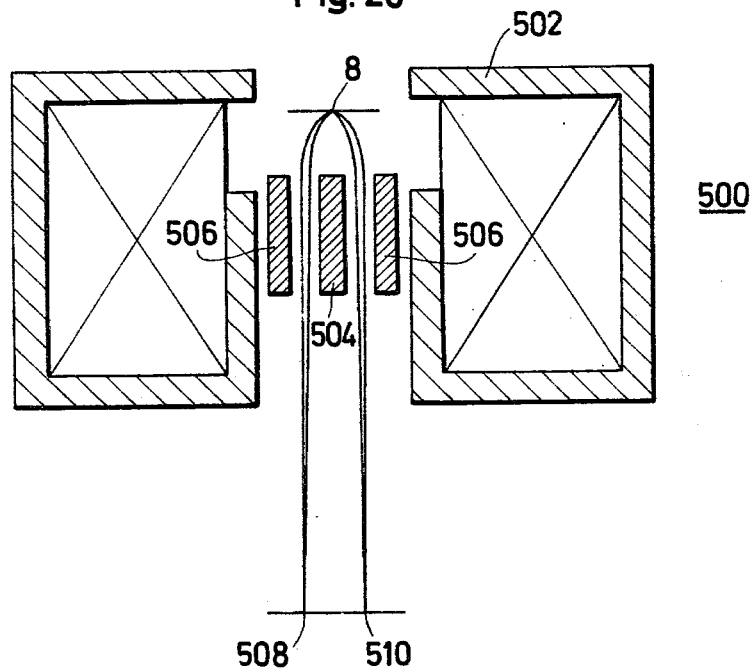
Figure 21:
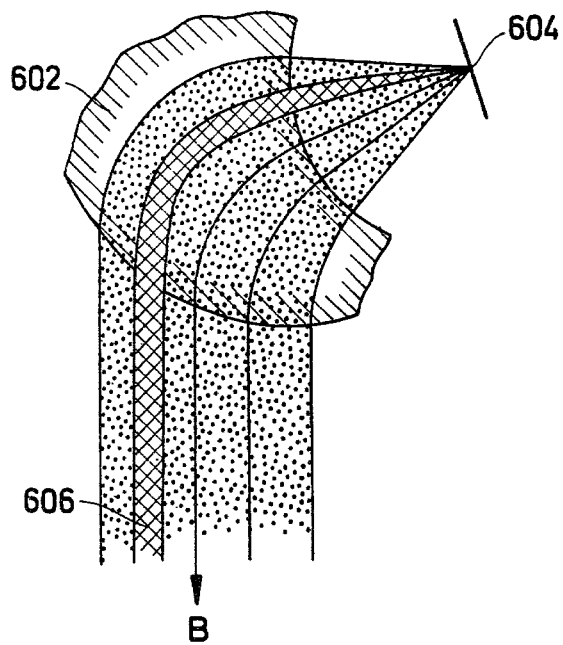
Figure 17:
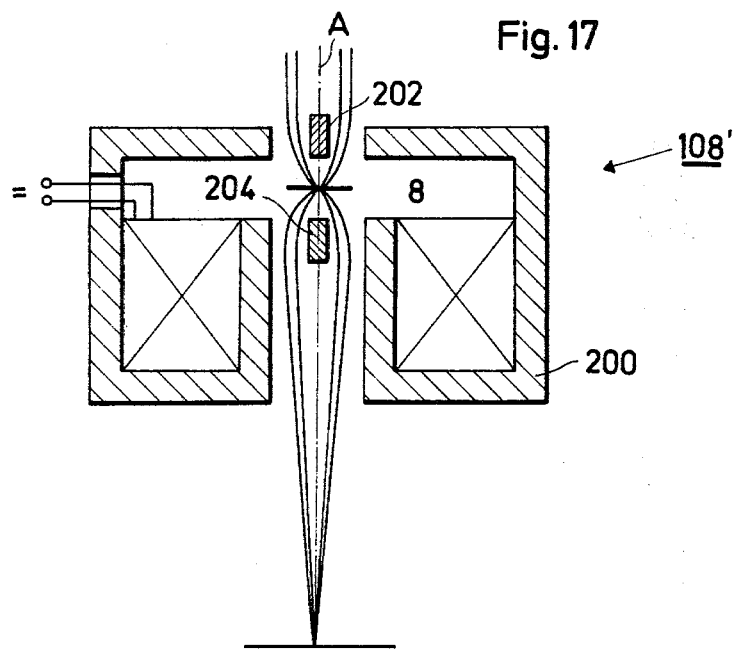
Figure 18:
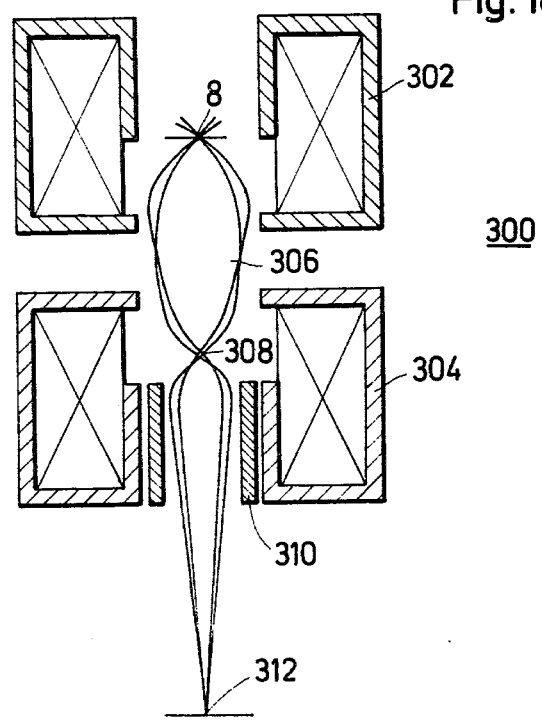
Figure 19:
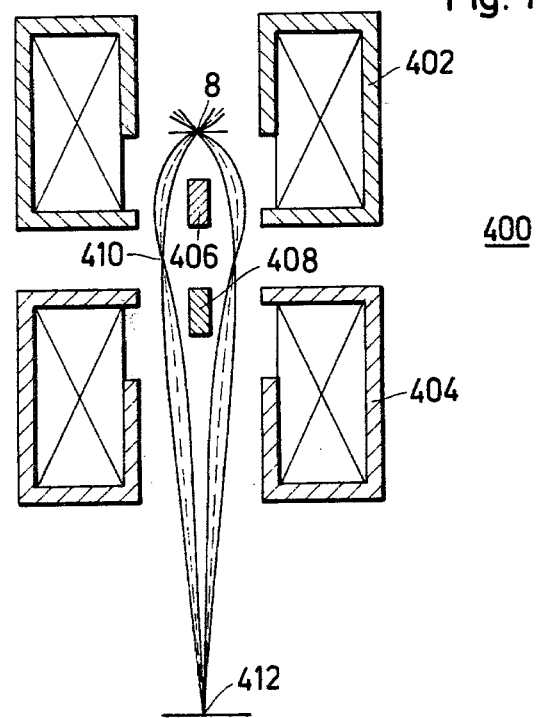

FIG. 17 an illuminating condensor and objective system which may be alternatively used in an apparatus of the type described with reference to FIG. 12;

FIG. 18 shows an astigmatism corrected lens system useful as objective means in an apparatus according to the invention;

FIGS. 19 and 20 show further lens systems useful in an apparatus according to the invention; and FIG. 21 shows a magnetic deflection system useful, e.g. as condensor and/or objective, in embodiments of the invention having a plane geometry.

The embodiments of the invention described below comprise numerous well-known components, such as electron sources, electron beam sources (guns), electron lenses and the like and employ principles well-known to the expert in the art. Thus, the embodiments will be described only as far as the invention is concerned, and reference is made in respect to the known components and principles to the copious publications relating to electron optics and the electron microscope, e.g. the book by V. K. Zworykin "Electron Optics and the Electron Microscope" published by John Wiley & Sons, Inc., New York, 1946; P. Grivet "Electron Optics" Pergamon Press 1965 and 1971; O. Klemperer "Electron Optics", Cambridge University Press 1971, and others.

Figure 1:
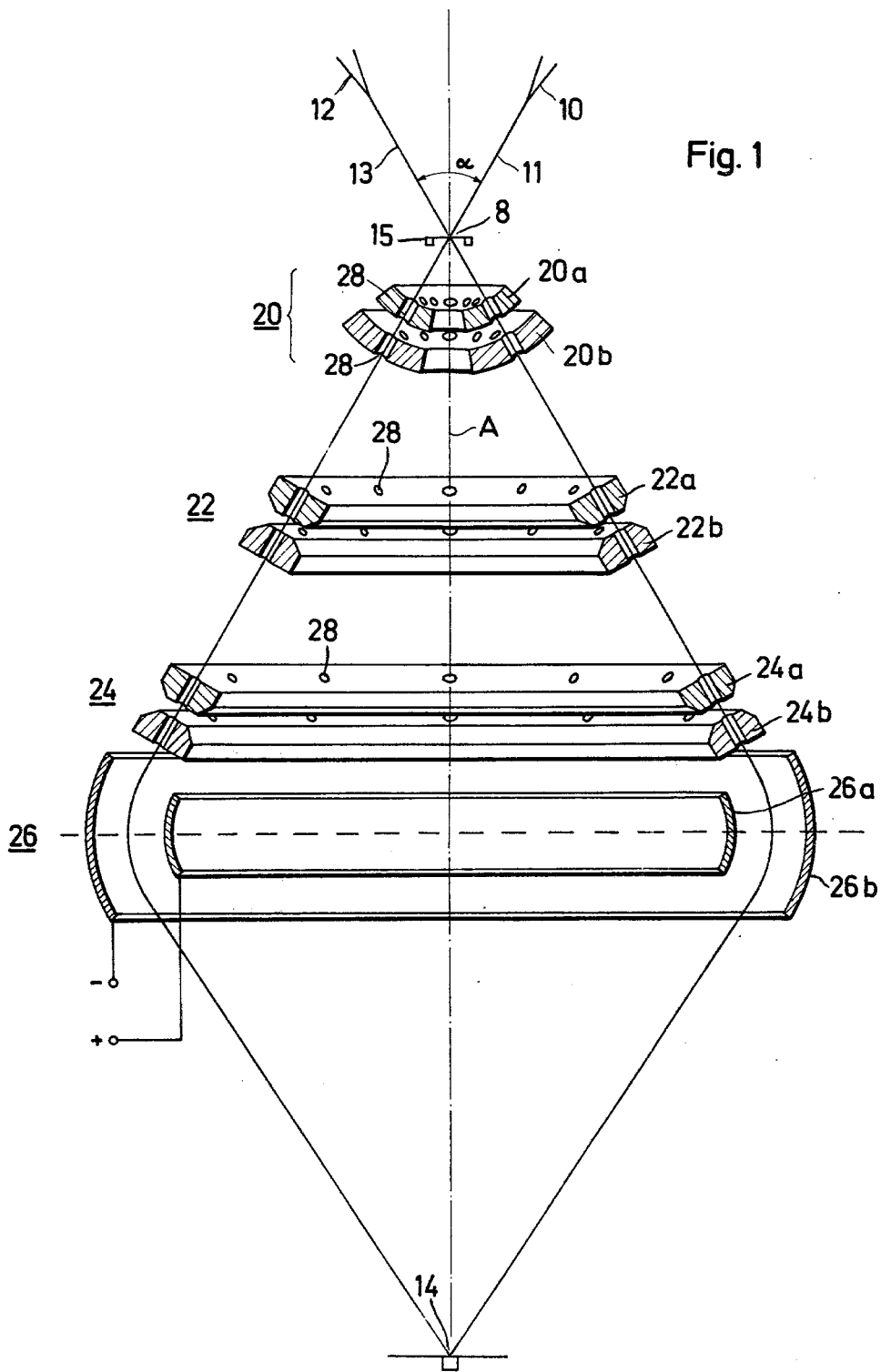
Figure 2:
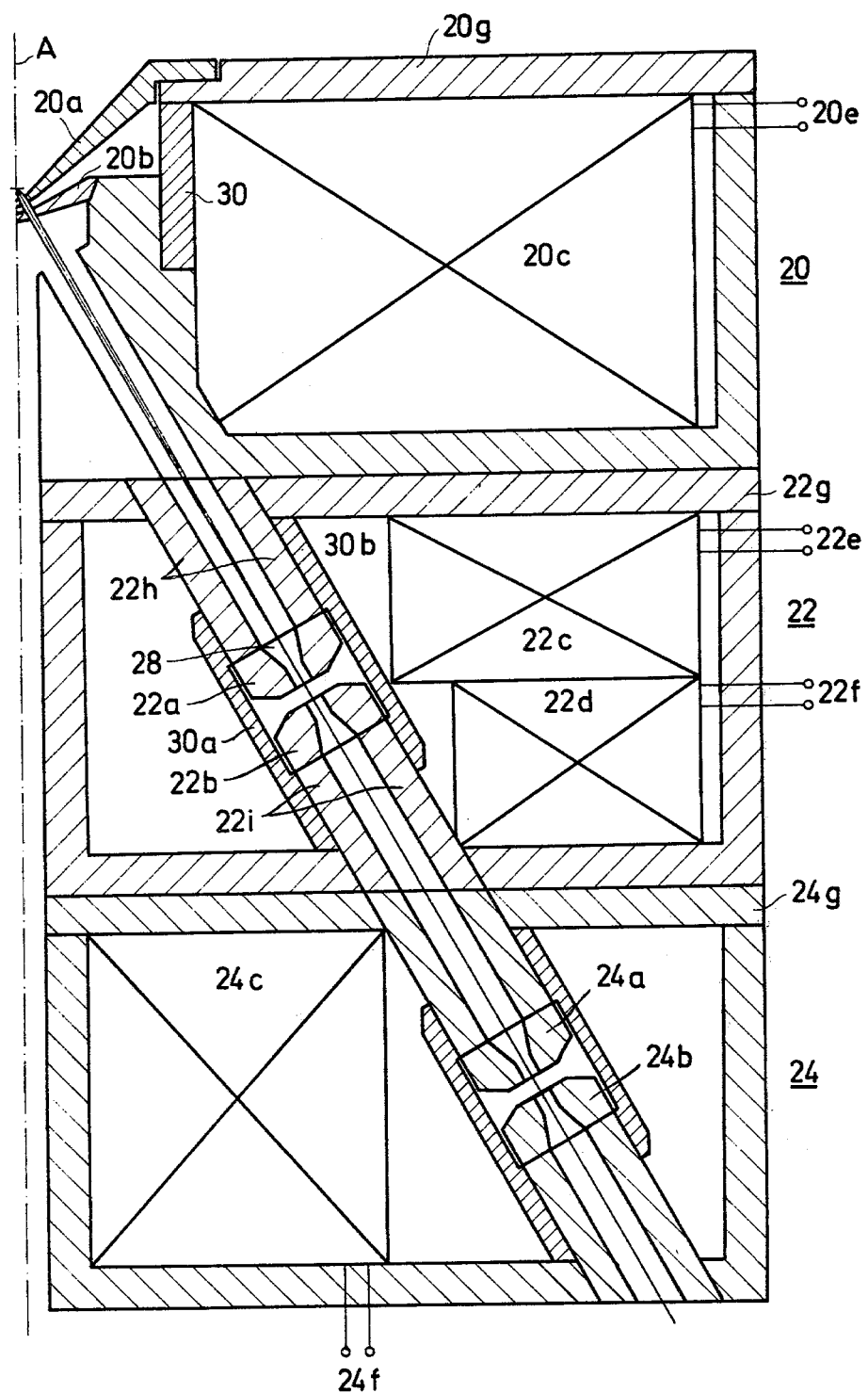

Referring now to FIGS. 1 and 2, there is shown a particle beam apparatus according to a first embodiment of the invention. It is assumed for the following description of this and other embodiments that the particles are electrons, however, it should be understood that the described embodiments may be easily adapted to operate with ions and ion beams, as is well-known in the art.

The embodiment shown in FIG. 1 comprises means for producing twelve component electron beams of which only two beams 11 and 13 are schematically depicted. In practice, more than twelve beams, e.g. 24 electron beams may be used and under certain conditions also less than twelve beams, e.g. only five beams may be employed.

The electron beams can be generated in various, known ways, e.g. by providing an individual source for each beam, e.g. a known electron gun or a field emission cathode system. Only two sources 10 and 12 are depicted diagrammatically for the beams 11 and 13, respectively, in FIG. 1. The beam sources preferably comprise a very small real or virtual particle source of high luminosity. Alternatively, a single particle source may be provided which delivers particles into an extended solid angle from which the various component beams are formed in well-known manner or a single beam may be deflected into a number of angular positions as in the embodiment shown in FIGS. 12 and 13. Beam sources of the type shown in FIGS. 10 and 11 may also be used.

The beams may be produced simultaneously or in time sequence. In the first case, individual particle detecting means should be provided for each beam while in the second case common particle detecting means operated in time-multiplexed fashion may be used.

The beams 11, 13 . . . are arranged on a conical surface which preferably has an apex angle a of at least 30 degrees, preferably 80 to 120 degrees so that each beam forms with an axis A of the cone (which is simultaneously the axis of the apparatus) an angle of at least 15 degrees, preferably between 40 to 60 degrees. The beams themselves are narrow, so-called ray bundles and have an aperture angle which is preferably below 1 or 2 degrees.

All of the beams meet within a predetermined small region within a specimen 8 having a three-dimensional structure to be determined. The specimen is supported by a conventional holder 15.

After having been transmitted by the specimen, the beams enter into an electron optics system which focusses the particles of each beam at a particle detecting device 14 which may be a photographic plate, a fluorescent screen, an electronic image converter or any other known means suited for deriving a representation of the density and/or energy distribution of the particles within each beam.

The electron optics system of the embodiment according to FIG. 1 comprises objective lens means 20, intermediate lens means 22, projective lens means 24 and electrostatic beam deflecting means 26. Only the active pole pieces of means 20, 22 and 24 are diagrammatically shown in FIG. 1; the more detailed construction will be explained with reference to FIG. 2.

Each of the lens means 20, 22, 24 forms as many magnetic lenses as beams are provided. Thus, the lens means 20, 22 and 24 each have a pair of ring-like magnetic pole members 20a and 20b, 22a and 22b, and 24a and 24b, respectively. Each pair of pole members 20a and 20b, 22a and 22b, and 24a and 24b is part of a magnetic lens structure shown in more detail in FIG. 2. Each lens structure comprises an iron shielded coil (depicted by a rectangle with diagonally crossing lines) and has turns which surround the axis A of the apparatus. Thus, the lens structures are essentially rotationally symmetrical with respect to the axis A.

Each ring-like magnetic pole member has a number of bores 28 aligned with and traversed by the individual beams. Thus, each pair of pole members has first and second bores forming a pair, being axially aligned and traversed by an individual beam as clearly visible in FIG. 1. Each pair of bores form with the surrounding magnet material of the pole members a magnetic lens and the lenses formed by the lens means 20, 22 and 24 for each beam act similar to the lens system of a conventional electron microscope.

The beams emerging from the projective lens means 24 with divergent beam axes are deflected to the common particle detecting device 14 by the electrostatic beam deflecting means which take the form of a capacitor having rotational symmetry. Thus, means 26 comprises two spaced coaxial electrodes which, in the embodiment shown, have the form of concentric sphere segments and produce, when properly energized, a radial electric field which deflects the individual beams toward a common point on the axis A where the particle detecting means 14 is positioned. Since the deflection angle depends on the velocity of the particles, the particle beams 11, 13, . . . should be as monochromatic as possible.

FIG. 2 shows a cross-sectional view of one half of the lens means 20, 22 and 24. The lens means are somewhat similar to a conventional magnetic round lens, however, with the exception that the active region is not a narrow circular space in the vicinity of the lens axis, as in a conventional magnetic round lens, but a number of individual subregions formed by the bores 28 and limited both in radial direction to a small ring-like area, and in circumferential direction to a number of small sector areas. By this means large beam angles with respect to the axis A can be coped with without encountering severe aberrations which would occur if conventional lenses were used in combination with large beam apertures.

The coils 20c, 22c and 22d, and 24c used to produce the magnetic fields for exciting the respective magnetic pole members are provided with terminals 20e, 22e, 22f, and 24f, respectively for connection to regulated and adjustable current supplies as well-known as in the art. The intermediate lens means has two coils 22c and 22d to accommodate the available space.

The coils are surrounded by iron shields 20g, 22g and 24g, respectively. The wall of the iron shield 20g facing the axis A has a circumferential slot into which a spacer 30 of non-magnetic material, e.g. brass is inserted. The magnetic pole members 20a and 20b are attached and magnetically coupled to the ring-like portions of the iron shield adjacent to the slot, as usual in a magnetic lens.

The iron shield 22g has upper and lower portions 22h and 22i, respectively, projecting obliquely with respect to the axis A into the chamber formed by the shield, and terminating at the magnetic pole members 22a, and 22b, respectively. Thus, each projecting portion is a ring-like member having the form of a portion of the mantle of a cone. Further, each projecting portion is provided with bores through which the individual beams can proceed. The gap between the pole members is bridged by an inner and outer spacer 30a and 30b, respectively of non-magnetic material.

The construction of the projective lens means 24 is similar to that of the intermediate lens means 22 with the exception that the coil 24c is between the beam paths and the axis A within the iron shield 24g for space considerations.

In operation, the beams 11, 13, . . . may be energized sequentially to record individual enlarged images of respective cross-sections of the predetermined region of the specimen at the particle detecting device. A photographic plate may be exposed for each beam. Alternatively, an electronic image detector, e.g. a television-type camera tube with a fluorescent screen may be used to produce the desidred representations of the particle distribution.

Figure 3:
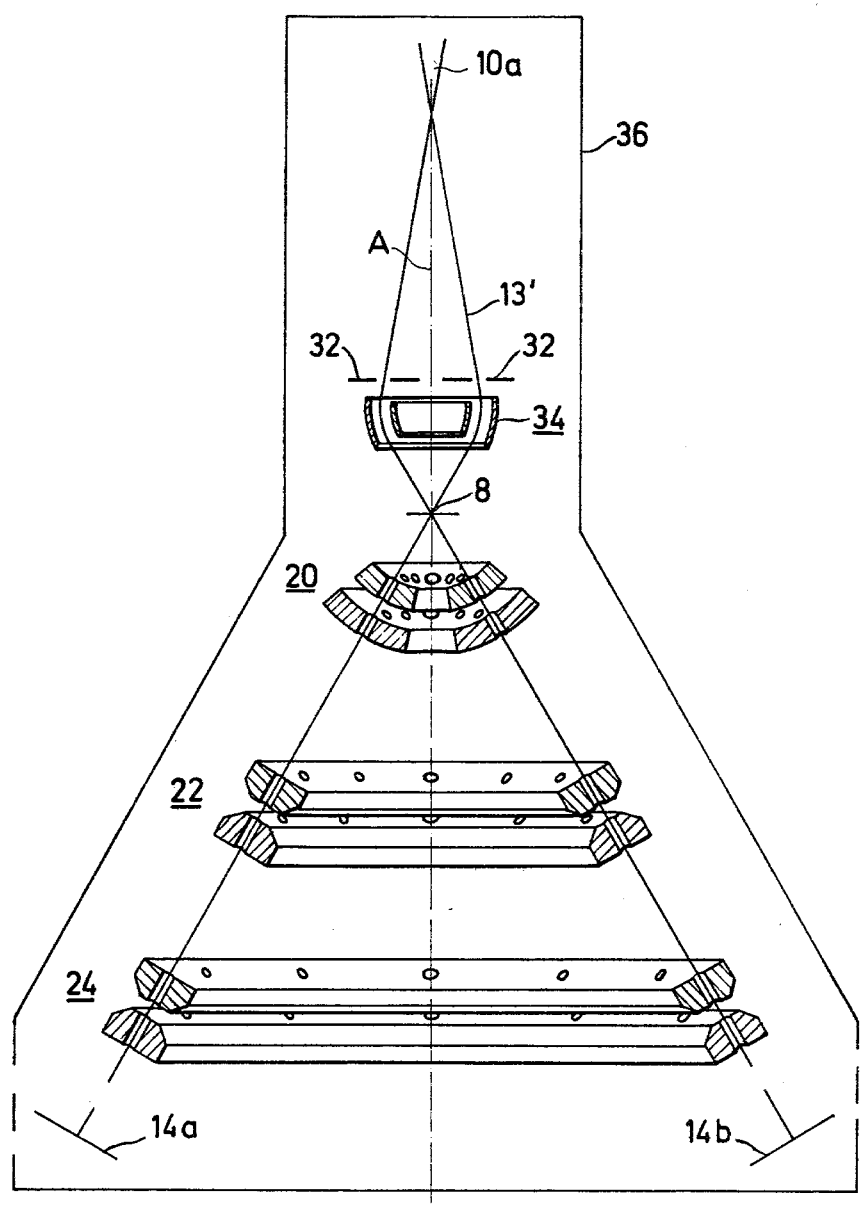

FIG. 3 illustrates a modification of the apparatus shown in FIG. 1. Similar components are provided with the same reference numbers. The embodiment shown in FIG. 3 differs from the embodiment shown in FIG. 1 firstly in that a single particle (e.g. electron) source 10a is provided which produces a conical beam 13' of which a number of component beams are formed by aperture stops 32 each having a hole. The holes are arranged on a circle similar to the holes 28 of the pole piece members and preferably are individually adjustable. Alternatively a single beam may be used and deflected into the individual beam path positions. The individual beams are converged by an electrostatic beam deflecting device 34 to meet within the predetermined, small region within the specimen 8, the three-dimensional structure of which is to be investigated.

The electrostatic beam deflection device 34 may be of the spherical capacitor type similar to means 26. The device 34 differs from means 26 in that it is not symmetrical with respect to an equatorial plane (a plane perpendicular to the axis A and comprising the portions of maximum diameter of the electrons). Thus, the angle between axis A and the axis of each beam entering the deflection device 34 is different (smaller) than the angle between the axis A and the beam portion traversing the specimen.

Figure 4:
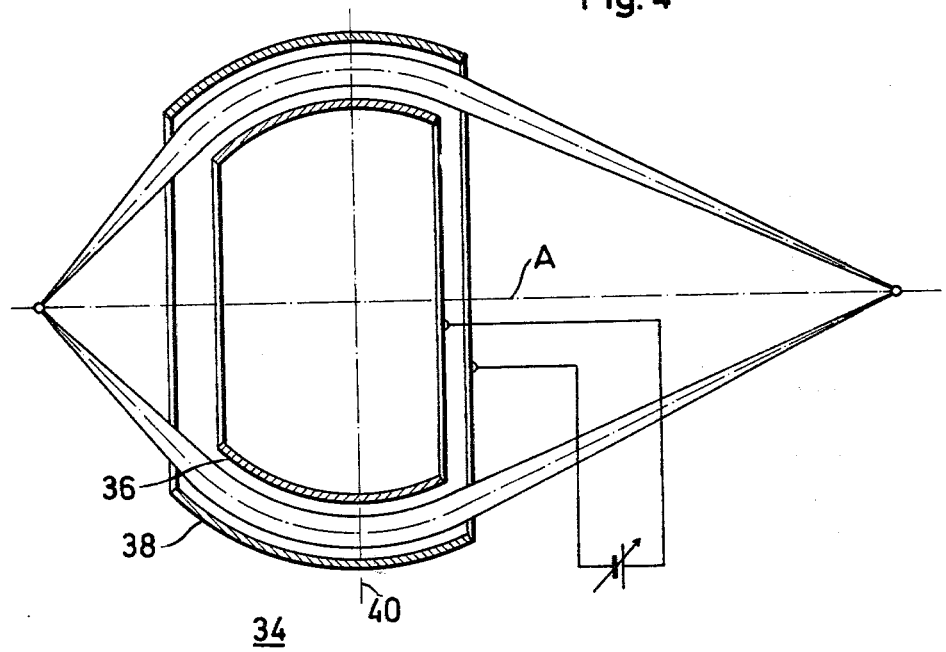

The electrostatic deflection device 34 is more clearly shown in FIG. 4. The device comprises spaced electrodes 36 and 38 which have the form of segments of concentric spheres. The equatorial plane is shown by a chain line 40. A electrostatic deflection device of the shown spherical capacitor type has imaging properties, as shown in FIG. 4, which are advantageously used to focus the particle beams diverging from the particle source into a very fine focus within the predetermined region under investigation.

Another electrostatic deflection device having rotational symmetry which may be alternatively used comprises spaced electrodes of cylindrical shape which are coaxial to axis A.

The component beams which have been transmitted by the specimen 8 proceed through objective, intermediate and projective lens means 20, 22 and 24, respectively, as in the embodiment shown in FIG. 1 and are focussed by this electron optical system on individual particle detecting devices of which only two are diagrammatically shown at 14a and 14b. Thus, images corresponding to all sections necessary for the Fourier calculations may be simultaneously produced.

FIG. 3 shows also diagrammatically a vacuum envelope 36 housing the various components of the apparatus as conventional in the electron microscope art.

Figure 5:
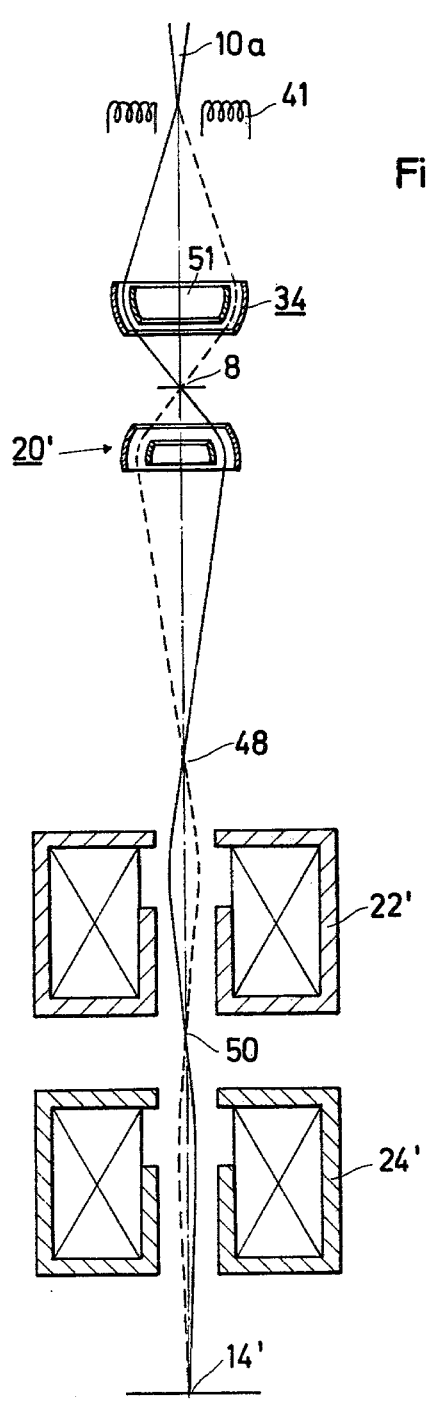

The embodiment shown in FIG. 5 comprises an electron source 10a including conventional gun means (not shown) for producing a narrow ray pencil, and an electrostatic deflection device 34 (acting as illumination condensor). The beam is deflected by a beam selecting device 41 comprising two pairs of magnetic deflection coils and an energizing system (not shown) to deflect the beam in each of a number of predetermined beam path positions.

Further, the embodiment of FIG. 5 comprises an objective 20' formed by an electrostatic deflection device similar to that used as condensor 34. The deflection device is shown as an spherical capacitor which is unsymmetrically with respect to the equatorial plane (40 in FIG. 4) such that the angle of the cone on which the axis of the beams entering the objective lie is very much larger, e.g. by the factor of about 50, than the angle of the cone on which the axes of the deflected beams lie which leave the spherical capacitor 20'. By this device, conventional magnetic round lenses can be used as intermediate lens means 22' and projective lens means 24' since the aperture angle occupied by the combination of beams entering that lens means is small enough to allow imaging of the beams onto a common particle detecting device 14' without objectional aberrations. The objective 20' forms an intermediate image 48 and the intermediate lens 22' forms a second intermediate image 50 similar to a conventional electron microscope.

Figure 7:
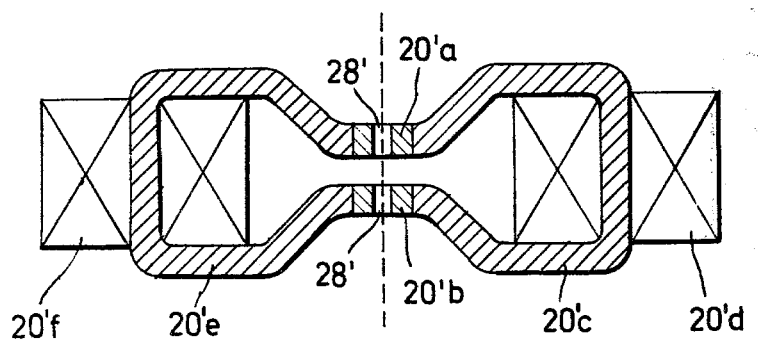
FIG. 7 is a sectional view showing a detail of the apparatus according to FIG. 6.
Figure 6:
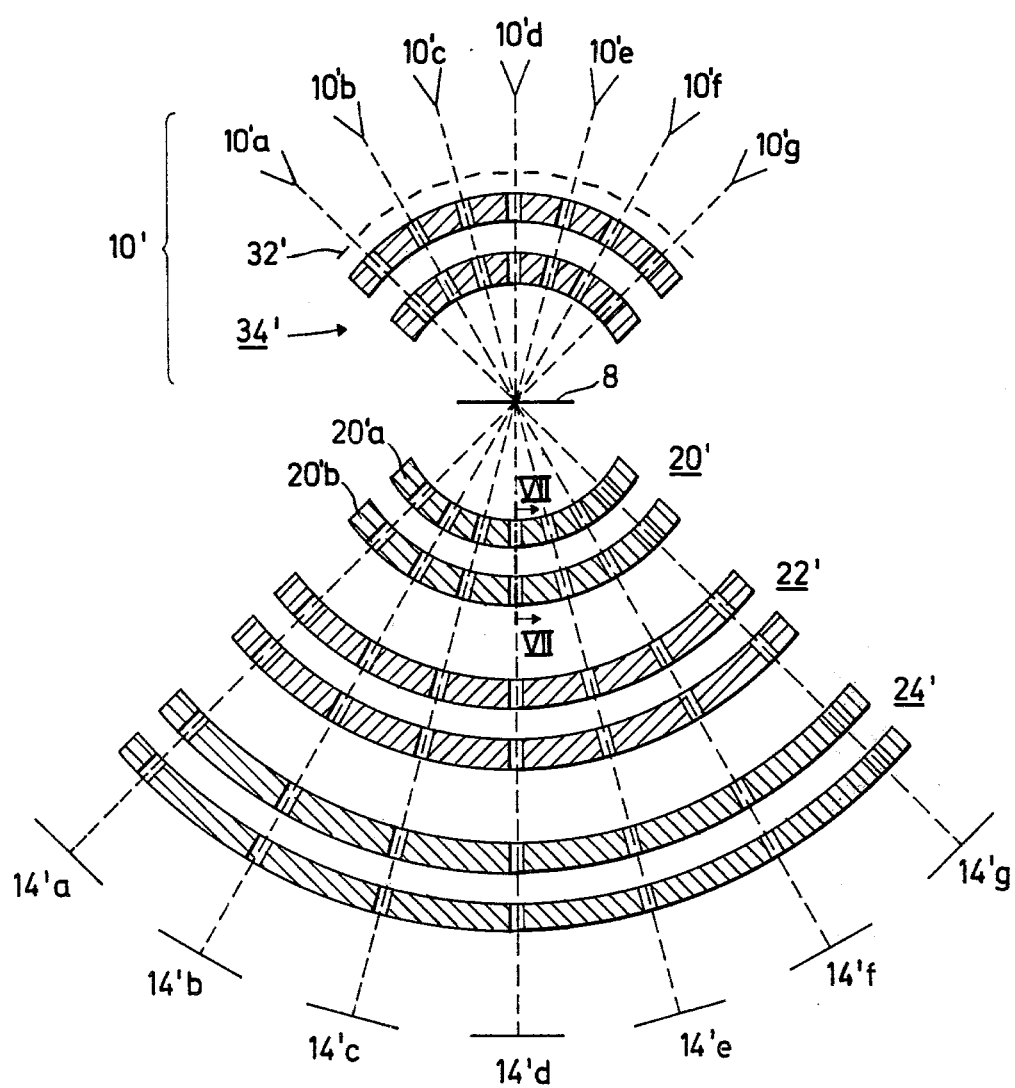
FIG. 6 illustrates a modification of the embodiment of FIG. 3 employing a plane geometry rather than the conical geometry of FIG. 3.

The embodiment shown in FIGS. 6 and 7 may be regarded as a plane equivalent to the apparatus shown in FIG. 3. Beam source means 10' produces a plurality of particle beams converging within a small region within a specimen 8 under investigation. The beam source means shown comprises a plurality of individual beam sources 10a, 10b ... and an illuminating condensor 34' which is a plane, reversed equivalent to the objective means 20 used in FIG. 3.

The individual beams which have traversed the specimen 8 enter into an electron or ion imaging system comprising objective means 20', intermediate lens means 22' and projecting lens means 24' which are the plane equivalent to the objective, intermediate lens and projective lens means 20, 22 and 24, respectively, in FIG. 3. The imaging system focusses the individual beams onto individual image detecting devices 14'a, 14'b, 14'c ... which may be of the type mentioned above.

Only the active pole pieces of the various particle optic lenses are depicted in FIG. 6 as in FIGS. 1 and 3. The lens system forming the illuminating condensor 34', the objective means 20', the intermediate lens means 22' and the projecting lens means 24' may be of similar construction and only the objective lens means 20' is therefore described in more detail with reference to FIG. 7 which shows a cross-sectional view of the objective lens means 20', taken along a broken line VII—VII in FIG. 6. The pole pieces 20'a and 20'b are integral with or magnetically coupled to at least one yoke member 20c and 20e surrounded by an excitation coil 20d and 20f, respectively. The pole pieces and the magnetic yoke members are made of a magnetically soft ferromagnetic material as well-known in the art.

Figure 8:
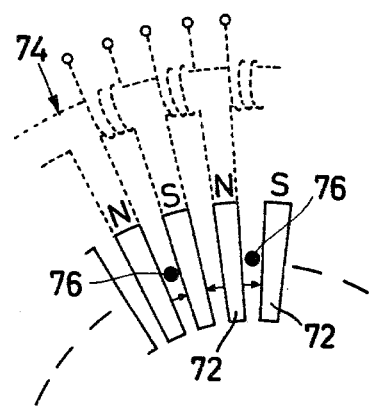
FIGS. 8 and 9 are plane and sectional views, respectively, of a beam deflection device useful in the invention.
Figure 9:
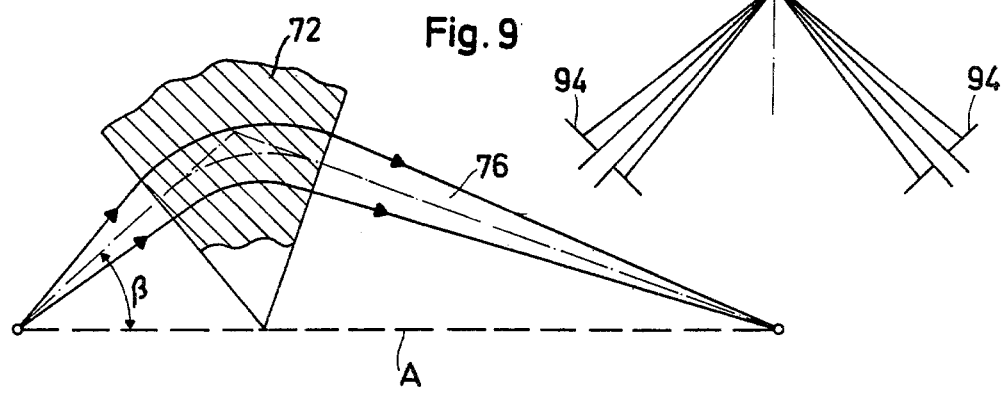

FIGS. 8 and 9 show a plane view and sectional elevation of a magnetic beam deflecting device 70 which may be used for each of the electrostatic beam deflectors 26, 34 or 20'. The beam deflecting device 70 comprises a number of wedge-like pole piece members 72 which are coupled to a magnetic excitation circuit 74 shown in phantom lines. The magnetic beam deflecting device 70 provides for essentially homogeneous circumferential magnetic fields between the pole pieces as schematically shown by circumferentially extending arrows, and it is well-known that such magnetic fields have deflecting and imaging properties as shown in FIG. 9. Also in this device, the beam paths 76 are limited to a small region limited both in radial and circumferential directions which allows proper correction also in cases where the beam axis forms a large angle $\beta$ with the axis A of the apparatus. A similar deflection field may be produced by a toroidal coil as shown diagrammatically at 77 in FIG. 8.

Figure 10:
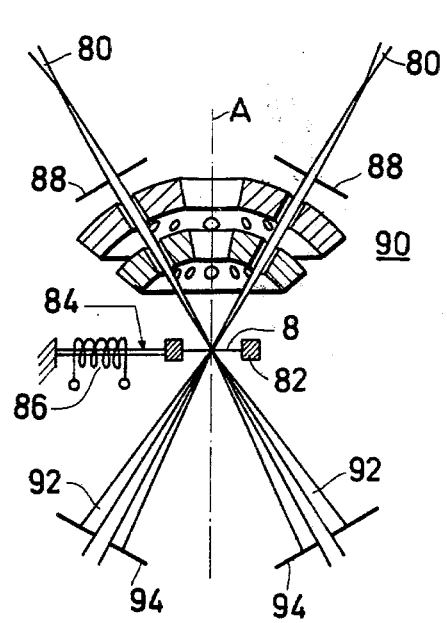

FIG. 10 shows a simple embodiment of the invention which operates on the scanning principle. A number of at least 10, preferably between 30 and 40 beam guns or sources 80 are provided (only two being shown in FIGS. 12) which are positioned on a circle and produce particle beams, e.g. electron beams converging towards and into a thin specimen 8 under investigation which is supported by a simple holder 82 movable in two mutually normal directions in the plane of the thin specimen by magnetostrictive actuating means which may comprise a nickel rod 84 surrounded by an excitation coil 86 which is energized by a conventional control signal source not shown. A second rod and coil system (not shown) extends and acts normal to the system shown. The beams produced by the beam sources travel each through an aperture step 88 and are focussed by a condensor lens system 90 into a predetermined small region within the specimen 8. The particles of each beam are scattered by the specimen and proceed within a scatter cone 92 towards individual particle detectors 94. Alternatively, the specimen may be fixed and the beams may be deflected to scan the specimen. In operation, all of the beam sources and detectors may be activated simultaneously and the specimen 8 or beams are moved in a raster-like fashion, whereby each detector records the particle distribution in the respective scatter cone which may be then electronically displayed in the usual manner to form the representations for calculating the three-dimensional structure of the specimen. The signals produced by the detectors 94 may also be fed directly into an appropriately programmed computer which calculates the three-dimensional structure. The calculation steps are known in the art and do not form part of the invention.

Figure 11:
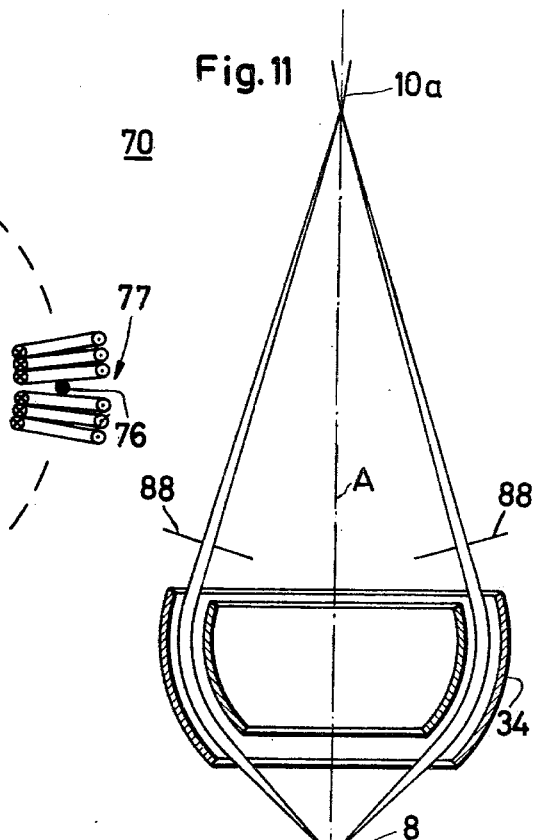
FIGS. 10 and 11 are simplified views of two further embodiments of the invention operating on the principle of the scanning electron microscope.

The embodiment shown in FIG. 11 has a particle source 10a and a condensor system 34 similar to those of the embodiment described with reference to FIG. 3.

Individual beams are formed by aperture stops 88. The electrostatic condensor system 34 may be combined with a correcting device 52' similar to that described with reference to FIG. 6.

In operation, the specimen 8 is translated relatively to the beams intersecting in a predetermined small region within the specimen, as described with reference to FIG. 10, and the particle detectors 94 produce signals comprising information about the distribution of the scattered particles.

Figure 12:
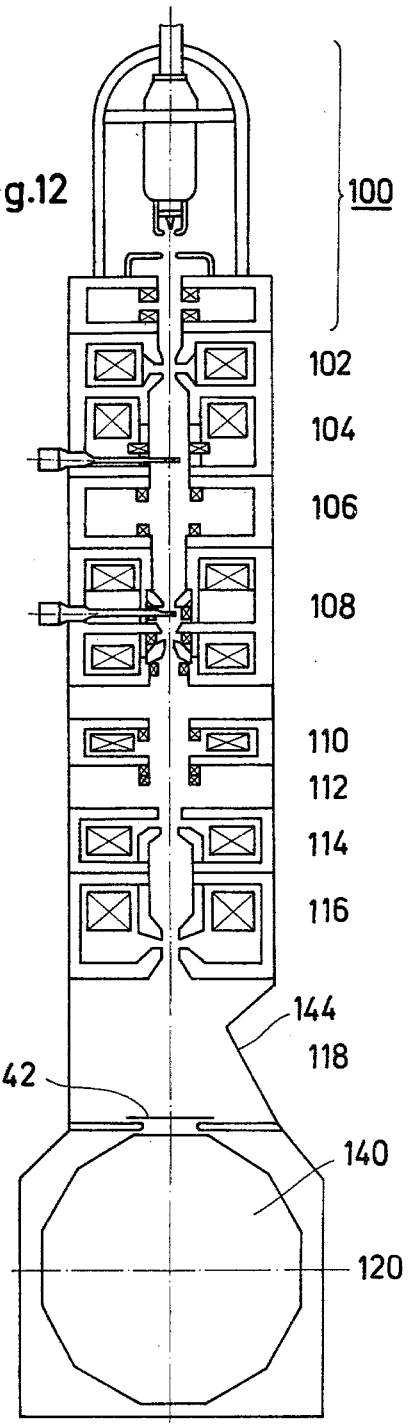
FIG. 12 illustrates a sectional elevation of another embodiment of the invention.
Figure 13:
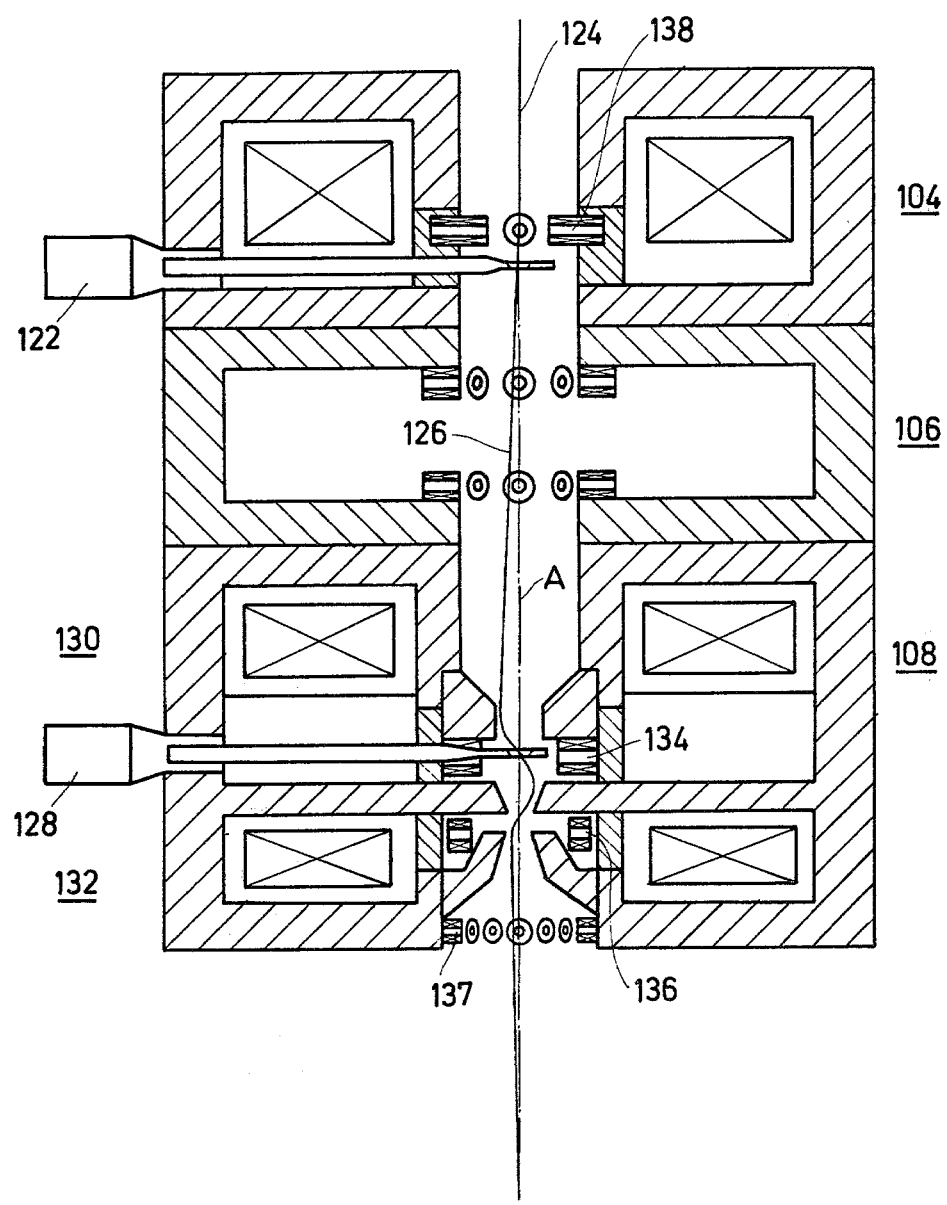
FIG. 13 shows a portion of the apparatus according to FIG. 12 on an enlarged scale in more detail.

The embodiment of which a sectional diagrammatic elevation is shown in FIG. 12 and the condensor and objective portion is shown in FIG. 13, comprises a beam source portion 100, a first condensor portion 102, a second condensor and deflection system portion 104, and double deflecting adjustment system portion 106, a sample and objective portion 108, an intermediate lens portion 110, a deflection system portion 112, first and second projective lens portions 114, 116, a monitor portion 118, and a photographic plate drum portion 120.

While the different beam paths were limited to small regions in circumferential and radial directions by physical components, as the walls of the bores 28 in FIG. 1, in the preceding embodiments, this limitation is effected in the embodiment according to FIGS. 12 and 13 essentially by magnetic fields (which may be partially or totally replaced by electrostatic fields as well-known in the art).

A narrow beam or ray bundle is produced in the beam source portion and focussed and shaped by the first and second condensor system which comprise magnetic lenses, in a well-known manner. An interchangeable aperture stop element 122 inserted in the second condensor portion as shown in detail in FIG. 13 is provided to limit the object area illuminated. The beam aperture is limited by the width of the image of a cross-over region formed in the beam source. The second condensor portion also comprises a deflection and stigmator system (which may be similar to that described below with reference to FIGS. 14 to 16) and provides for deflecting the collimated beam 124 into a number of distinguished angular positions. Each angular position corresponds to a different beam path, one of which being shown at 126 in FIG. 13. The deflected beam is deflected in radial inward direction by the objective system (which is of the single-field condensor objective type as described e.g. by Ruska in "Advances in Optical and Electron Microscopy 1" Academic Press London and New York 1966, pages 137 to 149) to travel through a predetermined small region within a specimen supported by a specimen holder 128. The objective system comprises first and second magnetic lenses 130, 132 provided with correcting devices 134 and 136, respectively each of which producing a multipole field to compensate for deviations from the rotational symmetry of the lens elements. Further an astigmatism correcting device 137 is provided which is similar to that explained with reference to FIGS. 14 to 16. The beam 124 may be shifted by a magnetic deflection system 138 comprising e.g. two pairs of coils into a predetermined number (e.g. 24) different positions and the correcting devices 134 and 136 each comprise a number (e.g. 12) of poles to provide for a quadrupole correcting field to compensate for the deviations from the rotational symmetry of the lens fields for each of the beam positions.

Figure 14:
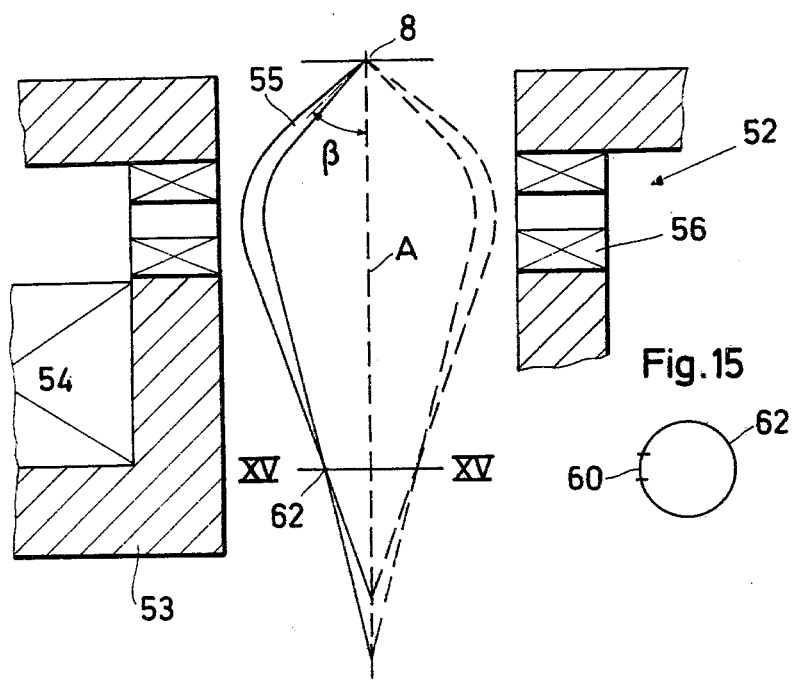
FIG. 14 shows a diagrammatic view of a round lens for explaining the astigmatism problem.

The purpose, construction and operations of the correcting devices will now be explained with reference to FIGS. 14 to 16. FIG. 14 is a diagrammatic cross-sectional view of a conventional round lens having an iron shield 53 and an excitation coil 54. The lens may be used as objective and deflects in such case the particle rays emerging from the specimen 8 back towards the axis A. If the paths of the particles forming a particle beam 55 form a large angle $\beta$ with the axis A, pronounced astigmatism effects will occur. Specifically, the particle paths (rays) emerging from specific point within the specimen 8 will travel as shown in FIG. 14 and form, in the plane XV–XV a so-called astigmatic intermediate ring image 62 shown in FIG. 15 where the rays going through a predetermined point of the specimen 8 and occupying a predetermined circumferential section are focussed into an elongated image 60 rather than into a point-like image. However, this elongated image 60 can be focused into the desired point-like image by a correcting device 52 if and only if a small sector limited in circumferential direction is taken into consideration.

The correcting device 52 comprises at least six, preferably eight or twelve air-core correcting coils 56 which may be positioned equally spaced in circumferential direction within the field producing gap of the iron shield 53 of the lens. The coils 56 allow to produce a quadrupole field pattern at any desired region within the lens aperture and, thus, for correcting the astigmatism and other aberrations of any beam 55 which is limited both in radial and in circumferential directions to small regions.

Figure 16A:
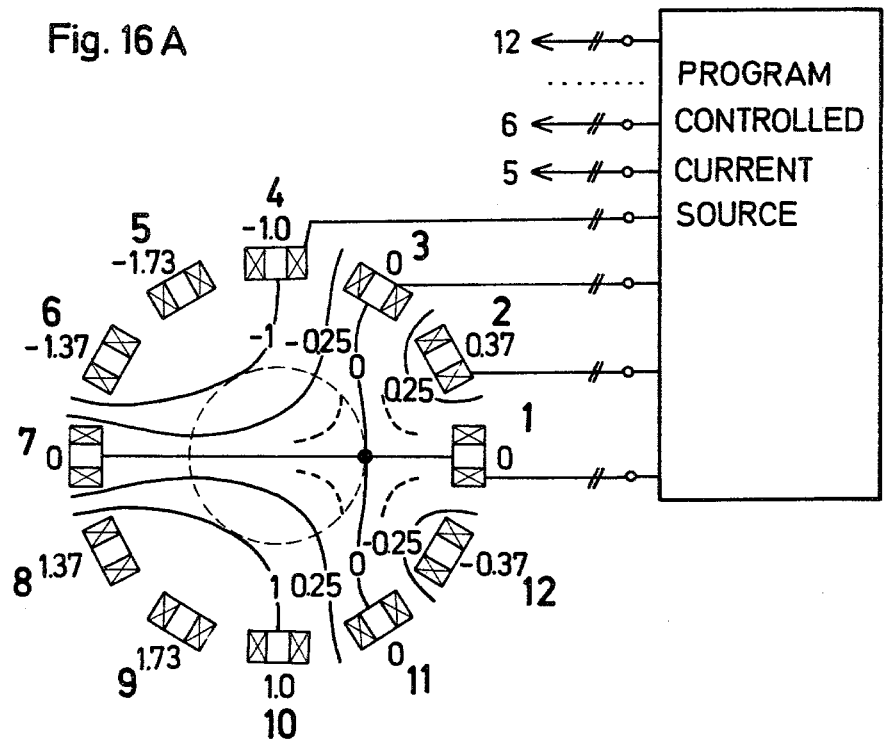
FIGS. 16A and 16B are diagrammatic views of quadrupole field patterns of the type produced by the correcting device described with reference to FIG. 14.
Figure 16B:
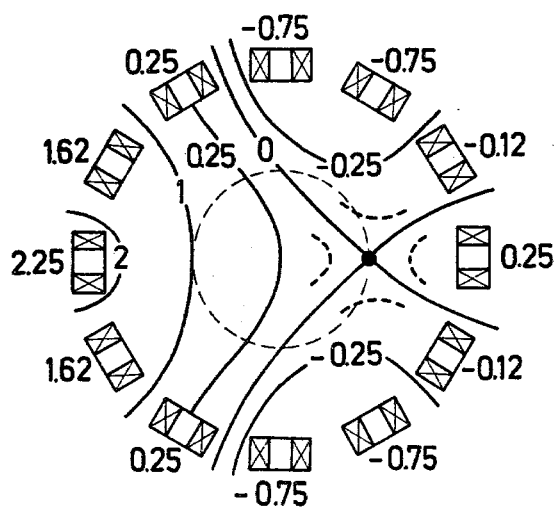

FIGS. 16A and 16B show possible magnetic potential patterns which form quadrupole fields centered on a desired beam path. The figures shown in FIGS. 16A and 16B give the relative magnitudes in arbitrary units.

FIGS. 16A and 16B apply to the case in which twelve correcting coils 56 are provided. Each coil may be connected by a two-lead line to a program controlled current source (as diagrammatically shown in FIG. 16A) which delivers a specific, adjustable current to each coil for each beam position. The program controlled current source may comprise a regulated current source, a switching device, current adjusting means for each beam position and each coil, and the switching device may be actuated in synchronism with the beam deflecting coils 138 (FIG. 13) to provide a proper correcting field for each beam path selected.

An electrode system providing an electrostatic quadrupole field may be used instead of the correcting coil system described with reference to FIG. 14, 16A and 16B.

The beam paths are limited in radial and circumferential directions to spaced small regions by the deflection and the action of the lenses 130 and 132 so that the various lenses following the deflection system 138 need to be and in fact are corrected only within radially narrow ring zones and the correcting quadrupole fields need to be effective only in such small regions and can provide for satisfactory correction even though the angle of the individual beams traversing the specimen with respect to the axis A is more than 15, preferably between 40 and 60 degrees and, thus, of a magnitude which is about two orders of magnitude above that which can be handled by conventional electron optical lenses and systems. In fact, the circumferential confinement of the region to be corrected allows a more sophisticated correction of aberrations and mechanical lens defects than the known stigmator correcting devices (see e.g. Grivet l.c. 2nd English Edition 1972 page 551).

The adjusting system 106 may also comprise means for producing a quadrupole field at any off-axis beam path position as described above and allows individually adjusting the positions and angles of each individual beam path.

Since the beam leaving the objective system 108 forms a small angle only with the axis A (as in the embodiment described as referenced to FIG. 5) the further processing of the beam can be effected by a more or less conventional intermediate lens and projective lens system.

The intermediate lens system 110 may be provided with correcting devices of the kind specified above to compensate for residual errors.

The deflection system 112 is controlled in synchronism with the deflection system 138 (FIG. 13) and serves to compensate for spurious deflection effects introduced by unsymmetries of the objective lens system so that all component beams form images at the same place.

The image for each beam may be recorded on an individual photographic plate supported by a polygonal plate drum 140 rotably supported in the housing of the apparatus so that the photographic plates can be sequentially brought into an active position where the respective beam is intercepted and recorded in the usual manner. The apparatus can be adjusted with the aid of a fluorescent screen 142 visible through a window 144 as usual in the electron microscope art.

FIG. 17 shows a lens system 108', which may be used as objective lens system, e.g. instead of the objective lens system 108 in FIG. 12. The lens system 108' is a core lens system of the single-field condensor-objective type mentioned above and comprises a suitable round lens 200. The lens aperture comprises, however, two cores 202 and 204, which are positioned coaxially to the lens and apparatus axis A before and after, respectively, of the specimen 8 under investigation.

The cores 202 and 204 are of essentially cylindrical shape and serves to modify the potential distribution of the lens field. The cores may comprise a body of magnetically soft material, such as permalloy, a permanent magnetic body and, a suitably energized magnet coil with or without an iron core body. Further, the cores may consist of an electrode producing an electrostatic field and cooperating with at least one radially spaced second electrode. Further, the cores may be made of superconductive material to provide the desired correction field.

The use of such lens cores is greatly facilitated since correction is needed only at a number of small regions within a small coaxial ring zone and small and spaced radial sectors.

FIG. 18 shows a lens system 300 which is also useful as an objective lens system. The lens system 300 comprises two single round magnetic lenses 302 and 304. The specimen 8 is positioned within the upper lens 302. The beam paths before the specimen 8 are not depicted and may be provided by any of the condensor systems described above. A cross-over 307 of the ray paths occurs between the lenses 302 and 304 and another cross-over 308 occurs in the region of the second lens 304. As astigmatism correction device 310 which is only schematically shown and may be of the type described with reference to FIGS. 14 to 16, is provided to act on the beams between the cross-over 308 and a focus plane 312 where an intermediate image may be formed. Thereafter, the beams may proceed through an intermediate and projective lens system, e.g. as disclosed with reference to FIG. 12.

The lens systems of FIGS. 12, 13, 17, 18 and 19 advantageously employ the so-called cone edge focus principle free from zero-order chromatic aberration (see e.g. W. Kunath, Electron Microscopy 1972, Proc. of the 5th European Congress on Electron Microscopy, Manchester, Institute of Physics, London and Bristol, page 70 and 71, and D. Typke and W. Hoppe, l.c. pages 72 and 73).

FIG. 19 shows a lens system 400 comprising two magnetic round lenses 402 and 404 and two cores 406 and 408 coaxially positioned within the first and second lenses 402 and 404, respectively. The first lens 400 produces at 410 an astigmated intermediate image (c.f. FIG. 15) and the beam is eventually focussed in a plane 412. The cores have the same purpose and function as explained with reference to FIG. 17.

FIG. 20 shows further embodiments of a lens system which may be advantageously used as the objective lens system in an apparatus according to the invention and comprises a special astigmatism correcting device. The specimen 8 under investigation is positioned in the region of a magnetic round lens 502. The beam paths before the specimen 8 are not shown. The individual beams emerging from the specimen travel through a ring zone between a central core 504 and a number of peripheral elements 506. The core 504 may be an element as disclosed with reference to FIG. 17, and the peripheral elements 506 may be part of a correcting device as disclosed with reference to FIGS. 14 to 16. The individual component beams (of which two are shown) do not meet at a common point after the specimen 8 but are focussed at individual image points 508, and 510, respectively. Thus, the images formed by the individual component beams can be recorded simultaneously or quasi-simultaneously, if desired after further enlargement by an intermediate lens and projective lens system.

FIG. 21 shows a magnetic lens which is useful for embodiments of the invention having a plane geometry. The lens is of known type and described in detail e.g. in "Tabellen zur angewandten Physik" Vol. 1, VEB Deutscher Verlag der Wissenschaften, Berlin 1962, page 574. The lens comprises a magnetic circuit having two pole pieces with opposed plane surfaces, one of which being shown at 602 in FIG. 21. The lateral margins of the pole pieces are cylindrical surfaces. Particles entering the convex side of the lens with parallel paths are focussed at 604. Thus, the lens may be used as a condensor to focus a number of individual spaced parallel primary beams to a small region of a specimen, one of such component beams being shown diagrammatically by the cross-hatched area 606. If the lens is used as an objective, component beams diverging into a fairly large, plane sector are collimated into parallel spaced component beams which may be processed further in the usual way.

The lens shown in FIG. 21 has imaging properties only in one direction. A cylinder lens may be provided for focussing the particles in the other direction, which may be formed by fringe fields at the margins of the pole pieces.

Figure 15:
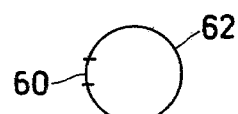
FIG. 15 shows a cross-section along a line XV—XV in FIG. 14.

The multipole correction system explained with reference to FIGS. 14 to 16 is also useful in the embodiments and systems described with reference to FIGS. 1 to 11, 17 and 19. A correction system of the type described may be advantageously employed e.g. in the apparatus shown in FIG. 1 after the objective 20; in the apparatus shown in FIG. 3 before the condensor 34; in the apparatus according to FIG. 5 before the condenser 34 and preferably also after the objective 20'; in the system shown in FIG. 17 a multipole correcting system may be provided which essentially surrounds the core 204 and another before (in FIG. 17 above) the core 202. The system shown in FIG. 19 may comprise a multipole correction device in the region of each of the lens fields (similar to FIG. 14).

It is to be noted that the ray paths shown in FIG. 18 after the specimen 8 are in fact similar to those which will be established in the objective portion of the system shown in FIG. 13.

The various coils for energizing the lenses and the coils for coarse corrections may be made of superconductor materials so that no external current source is needed for maintaining the various magnetic fields. Such and other modifications will be readily apparent to those skilled in the art.

I claim:

1. A transmission-type charged particle beam apparatus comprising a vacuum envelope enclosing:
   (a) first means, including at least ten individual charged particle sources, for separately producing at least ten individual charged particle beams;
   (b) second means for supporting a specimen to be investigated;
   (c) third means for projecting each of said beams along a different beam path through a predetermined region of the specimen supported by said second means, said beam paths collectively converging about a rotational axis of symmetry of said apparatus and at equal angles of at least 30° to said axis so as to intersect at an apex lying within said predetermined region of said specimen;
   (d) individual particle detecting means for each beam; and
   (e) a particle optics lens system for focussing each of said beams transmitted through said specimen onto a corresponding one of said particle detecting means for separate detection thereby of the charged particles of each beam, said lens system including at least one particle optics lens having an annular apertured pole structure to produce for each beam a deflecting field limited to a respective radial and circumferential area of said pole structure.

2. An apparatus according to claim 1, wherein said pole structure comprises two annular magnetic pole pieces positioned concentrically with respect to said axis of symmetry and in spaced alignment with one another in the beam path directions, each pole piece having a respective beam-passing bore axially aligned with each beam path, said particle optics lens having means for magnetically energizing said pole pieces.

3. An apparatus according to claim 1, wherein said particle optics lens is an objective lens, intermediate lens or projective lens of said lens system.

4. A transmission-type charged particle beam apparatus comprising a vacuum envelope enclosing:
   (a) first means, including at least ten individual charged particle sources, for separately producing at least ten individual charged particle beams;
   (b) second means for supporting a specimen to be investigated;
   (c) third means for projecting each of said beams along a different beam path through a predetermined region of the specimen supported by said second means, said beam paths collectively converging about a rotational axis of symmetry of said apparatus and at equal angles of at least 30° to said axis so as to intersect at an apex lying within said predetermined region of said specimen;
   (d) a single particle detecting means for detecting charged particles impingent thereon; and
   (e) a particle optics lens system for focussing each of said beams transmitted through said specimen onto said particle detecting means for separate detection thereby of the charged particles of each beam, said lens system including at least one particle optics lens having an annular apertured pole structure to produce for each beam a deflecting field limited to a respective radial and circumferential area of said pole structure, said lens system further including annular beam deflection means for deflecting each beam from a path it has as it leaves said particle optics lens to a path intersecting said axis of symmetry at a common focal region for each beam, said particle detecting means being positioned at said focal region, said third means being arranged to project each beam in sequence to enable said particle detecting means separately and sequentially to detect the charged particles of the individual beams.

5. An apparatus according to claim 4, wherein said annular beam deflection means comprises an electrostatic deflection device having two spaced electrodes of the shape of concentric segments positioned coaxially with said axis of symmetry, said spherical segments having coinciding equatorial planes normal to said axis of symmetry, and means for energizing said electrodes to produce between them an electrostatic deflective field for said deflecting of each beam.

6. An apparatus according to claim 1, wherein said third means includes an electrostatic deflection device of the spherical capacitor type comprising two spaced electrodes having the shape of concentric spherical segments positioned coaxially with said axis of symmetry and unsymmetrically with coinciding equatorial planes thereof normal to said axis of symmetry, and means for energizing said electrodes to produce between them an electrostatic field for said projecting of each beam through said predetermined region of said specimen.

7. A transmission-type charged particle beam apparatus comprising a vacuum envelope enclosing:
   (a) first means, including at least ten individual charged particle sources, for separately producing at least ten individual charged particle beams;
   (b) second means for supporting a specimen to be investigated;
   (c) third means for projecting each of said beams in time sequence along a different beam path through a predetermined region of the specimen supported by said second means, said beam paths collectively converging about a rotational axis of symmetry of said apparatus and at equal angles of at least 30° to said axis so as to intersect at an apex lying within said predetermined region of said specimen;
   (d) individual particle detecting means for each beam; and
   (e) a particle optics lens system for focussing each of said beams transmitted through said specimen onto a corresponding one of said particle detecting means for separate detection thereby of the charged particles of each beam, at least one of said third means and said particle optics lens system comprising electrostatic deflection means having at least two annular electrodes coaxial with said axis, radially spaced with respect to said axis and rotationally symmetrical to said axis.

8. A transmission-type charged particle beam apparatus comprising a vacuum envelope enclosing:
   (a) first means, including at least ten individual charged particle sources, for separately producing at least ten individual charged particle beams;
   (b) second means for supporting a specimen to be investigated;
   (c) third means for projecting each of said beams along a different beam path through a predetermined region of the specimen supported by said second means, said beam paths lying in a common plane and being angularly spaced from one another within a sector zone of at least 60°;
   (d) individual particle detecting means for each beam; and
   (e) a particle optics lens system for focussing each of said beams transmitted through said specimen onto the individual particle detecting means provided therefor, said lens system comprising at least one particle optics lens having an annular apertured pole structure for producing a deflecting field for each beam, each deflecting field being limited to a respective minor portion of said sector zone.

9. A transmission-type charged particle beam apparatus comprising a vacuum envelope enclosing:
   (a) first means, including a charged particle source, for producing a single, conical, charged particle beam;
   (b) second means for forming at least ten component beams from said single conical beam and directing each component beam along respectively different beam paths divergent with respect to one another;
   (c) third means for supporting a specimen to be investigated;
   (d) fourth means for projecting each of said component beams through a predetermined region of the specimen supported by said third means, said divergent beam paths being altered in direction to collectively converge about a rotational axis of symmetry of said apparatus at equal angles of at least 30° to said axis so as to intersect at an apical point lying within said predetermined region of said specimen;
   (e) individual particle detecting means for each beam; and
   (f) a particle optics lens system for focussing each of said component beams transmitted through said specimen onto a corresponding one of said particle detecting means for separate detection thereby of the charged particles of each component beam, said lens system including at least one particle optics lens having an annular apertured pole structure to produce for each component beam a deflecting field limited to a respective radial and circumferential area of said pole structure.

10. An apparatus according to claim 9, wherein an astigmatism correcting system is provided having at least six field producing poles spaced circumferentially around said axis within the region of an objective lens of said lens system, said correcting system being capable of producing an astigmatism correcting field of circumferentially and radially limited extension at each component beam path within said objective lens region, said component beam paths occupying regions of space within a condenser lens of said lens system and within said objective lens thereof which are limited, except at the location of component beam path cross-overs on said axis, to radial regions spaced from said axis and, in circumferential directions, to angular sectors centered with respect to said component beam paths.

11. A transmission-type charged particle beam apparatus comprising a vacuum envelope enclosing:
   (a) first means, including charged particle source means, for producing at least ten charged particle beams;
   (b) second means for supporting a specimen to be investigated;
   (c) third means for projecting each of said beams in time sequence along a different beam path through a predetermined region of the specimen supported by said second means, said beam paths collectively converging about a rotational axis of symmetry of said apparatus and at equal angles of at least 30° to said axis so as to intersect at an apex lying within said predetermined region of said specimen;
   (d) a single particle detecting means for detecting charged particles impingent thereon; and
   (e) a particle optics lens system for focussing each of said beams sequentially transmitted through said specimen onto said single particle detecting means, at least one of said third means and said particle optics lens system comprising electrostatic deflection means having at least two annular electrodes coaxial with said axis, radially spaced with respect to said axis and rotationally symmetrical to said axis.

* * * * *